United States Patent
Fledell et al.

(10) Patent No.: US 9,128,121 B2
(45) Date of Patent: Sep. 8, 2015

(54) MECHANISM FOR FACILITATING A DYNAMIC ELECTRO-MECHANICAL INTERCONNECT HAVING A CAVITY FOR EMBEDDING ELECTRICAL COMPONENTS AND ISOLATING ELECTRICAL PATHS

(71) Applicants: Evan M. Fledell, Beaverton, OR (US); Joe F. Walczyk, Tigard, OR (US); Dinia P. Kitendaugh, Beaverton, OR (US)

(72) Inventors: Evan M. Fledell, Beaverton, OR (US); Joe F. Walczyk, Tigard, OR (US); Dinia P. Kitendaugh, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 216 days.

(21) Appl. No.: 13/629,891

(22) Filed: Sep. 28, 2012

(65) Prior Publication Data

US 2014/0091824 A1   Apr. 3, 2014

(51) Int. Cl.
*G01R 1/067* (2006.01)
*H02J 15/00* (2006.01)
*H01R 13/24* (2006.01)

(52) U.S. Cl.
CPC ........ *G01R 1/06722* (2013.01); *H01R 13/2421* (2013.01); *H02J 15/00* (2013.01); *Y10T 29/49117* (2015.01); *Y10T 29/49169* (2015.01)

(58) Field of Classification Search
CPC ...... G01R 1/00; G01R 1/067; G01R 1/06716; G01R 1/07314; G01R 3/00; G01R 31/26; G01R 1/06738; G01R 1/06722; G01R 1/0408; G01R 1/0466; G01R 1/073; G01R 1/06783; G01R 1/06794; G01R 1/071; G01R 1/072; G01R 1/06705; G01R 31/04; G01R 1/07342; G01R 1/06711; H02J 15/00; H01R 43/00; H01R 13/2421; Y10T 29/49117; Y10T 29/49169
USPC .......................................... 307/109; 333/133
See application file for complete search history.

(56) References Cited

U.S. PATENT DOCUMENTS

| | | | | |
|---|---|---|---|---|
| 5,945,837 | A * | 8/1999 | Fredrickson | 324/754.08 |
| 6,323,638 | B2 * | 11/2001 | McNulty | 324/149 |
| 6,396,293 | B1 * | 5/2002 | Vinther et al. | 324/755.05 |
| 6,456,172 | B1 * | 9/2002 | Ishizaki et al. | 333/133 |
| 6,466,000 | B1 * | 10/2002 | Nightingale | 324/72.5 |
| 6,677,772 | B1 * | 1/2004 | Faull | 324/755.05 |
| 6,801,104 | B2 * | 10/2004 | Zhu et al. | 333/202 |
| 7,288,952 | B2 * | 10/2007 | Goto | 324/755.05 |
| RE40,890 | E * | 9/2009 | Small et al. | 333/208 |
| 2007/0018666 | A1 * | 1/2007 | Barabi et al. | 324/761 |
| 2012/0139528 | A1 * | 6/2012 | Burnett et al. | 324/149 |
| 2013/0337666 | A1 * | 12/2013 | Walczyk et al. | 439/66 |

FOREIGN PATENT DOCUMENTS

EP         1160575 A2 *  12/2001  ............. G01R 1/067

* cited by examiner

*Primary Examiner* — Melissa Koval
*Assistant Examiner* — Felicia Farrow
(74) *Attorney, Agent, or Firm* — Blakely, Sokoloff, Taylor & Zafman LLP

(57) ABSTRACT

A mechanism is described for facilitating a dynamic electro-mechanical interconnect capable of being employed in a test system according to one embodiment. A method of embodiments of the invention may include separating, via a cavity, a first conductor of an interconnect from a second conductor of the interconnect, and isolating, via the cavity serving as a buffer, a first electrical path provided through the first conductor from a second electrical path provided through the second conductor.

18 Claims, 5 Drawing Sheets

MECHANISM FOR FACILITATING A DYNAMIC ELECTRO-MECHANICAL INTERCONNECT HAVING A CAVITY FOR EMBEDDING ELECTRICAL COMPONENTS AND ISOLATING ELECTRICAL PATHS

FIELD OF THE INVENTION

The present disclosure generally relates to test platforms, and more particularly, to a dynamic electro-mechanical interconnect capable of being employed at a test platform.

BACKGROUND

Electronic or in-circuit testing (ICT) often includes testing a device under test (DUT) for various factors, such as shorts, opens, resistance, capacitance, etc., and purposes, such as filtering, bypassing, power decoupling, etc. Typically, a DUT is connected to a manual or automated test equipment (ATE) using pogo pines or a bed of nails. A pogo pin, for example, may be used to establish a temporary connection between two printed circuit boards (PCBs).

However, it is common to encounter a performance gap for the DUT between how it is used at the end use system and tested at the test system. Without a proper interconnect technology solution, conventional solutions fail to bridge that performance gap. For example, conventional solutions like having socket pin contacts with shorter length or larger width are known to have shown deficiencies in the usage model whether it be relating to electrical performance, mechanical performance, lifetime of the technology, commercial limitations, or the like.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Figure 1:
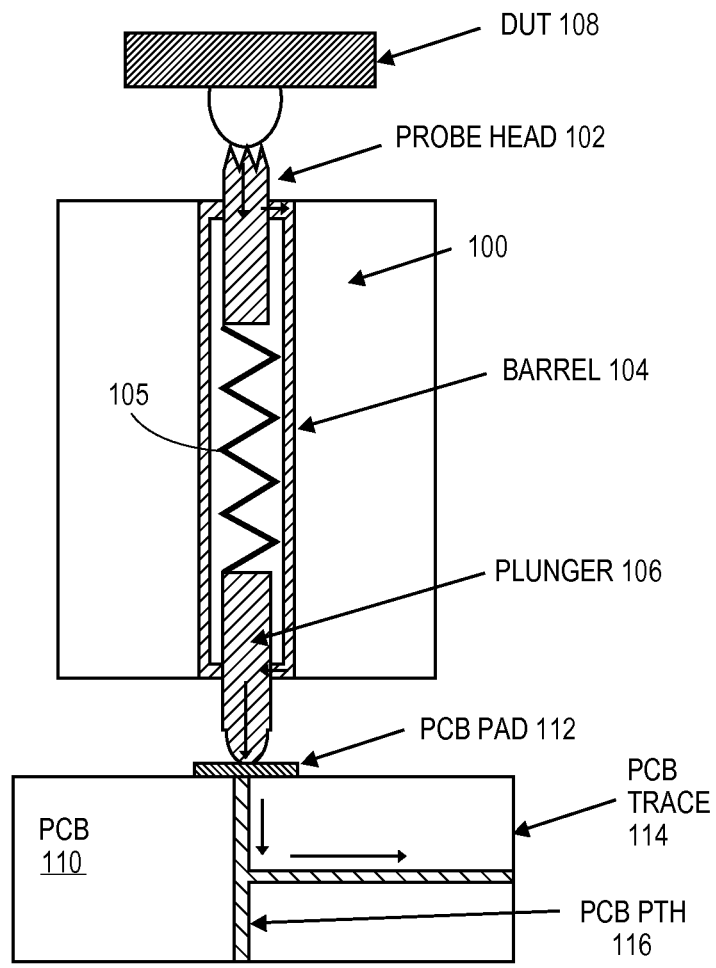
FIG. 1 illustrates a conventional pogo pin.

FIG. 1 illustrates a conventional pogo pin 100. Pogo pin 100 is applied here as an interconnect between a DUT 108 and a PCB 110. The illustrated conventional pogo pin 100 includes a conductive probe pin head 102, a barrel 104 having a conductive spring 105, a plunger 106. PCB 110 is shown to include a PCB pad 112, a PCB trace 114, and a PCB plated thru holes (PTH) 116.

A DUT 108 may include an integrated circuit (IC) die on a wafer, or a packaged part. A PCB 110 may be referred to as printed wiring board (PWB) or etched wiring board (EWB) and found in electronic devices are used to mechanically support and electrically connect electronic components using conductive pathways etched from copper sheets laminated onto a non-conductive substrate.

Figure 2A:
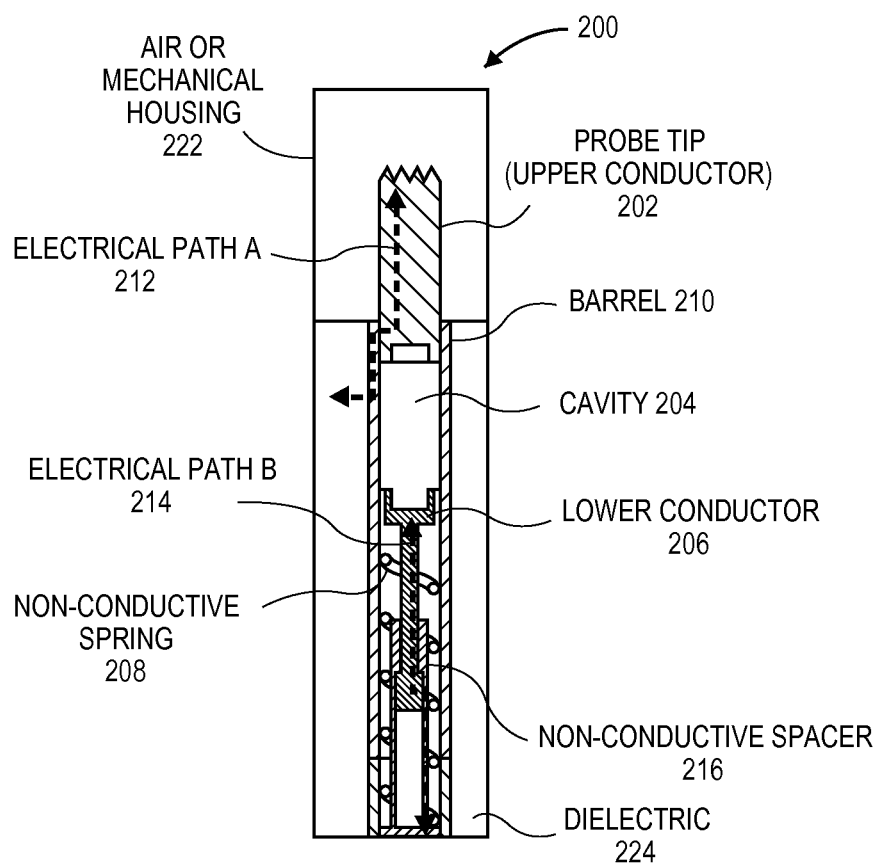
FIGS. 2A and 2B illustrate an electro-mechanical interconnect according to one embodiment.

FIG. 2A illustrates an electro-mechanical interconnect 200 according to one embodiment. In the illustrated embodiment, electro-mechanical interconnect ("interconnect") 200 refers to a single electro-mechanical assembly ("assembly") is shown as placed at dielectric 224 (e.g., a PCB or any other component of a platform, such as a socket) and partially exposed in the air or a mechanical housing 222 having one or more DUTs. For example, interconnect 200 includes conductive probe tip (also referred to as "upper conductor" or "probe head") 202 capable of being attached to any number and type of DUTs, lower conductor 206 (that is capable of being linked to ground via a reference plane), and non-conductive spring 208. In one embodiment, spring 208 provides the necessary mechanical compliance, such as for compression purposes as will be further illustrated with reference to FIG. 3, while its non-conductiveness supplements cavity 204 in facilitating the separation and isolation of electrical path A 212 from electric path B 214 as will be subsequently described in this document.

As aforementioned, in one embodiment, interconnect 200 further includes cavity 204 occupying a portion of conductive barrel 210 of variable length and residing between probe tip 202 and lower conductor 206. Cavity 204 may refer to an empty space of a variable shape and size capable of embedding or occupying one or more discrete components, such as a capacitor, an inductor, a resistor, any high electric constant filler material-based component, a multi-terminal electronic component, etc. In one embodiment, cavity 204 serves to separate upper conductor or probe tip 202 from lower conductor 206 while providing a sufficient amount of space to hold or embed a customized or off-the-shelf electrical component (e.g., a capacitor, a conductor, a resistor) as desired or necessitated by a testing system that employs interconnect 200 to achieve maximum performance, greater power efficiency, etc., such as based on the nature of the DUT being tested by the testing system and/or by an administrator (e.g., an individual) authorized or responsible for administering the DUT testing.

Figure 3:
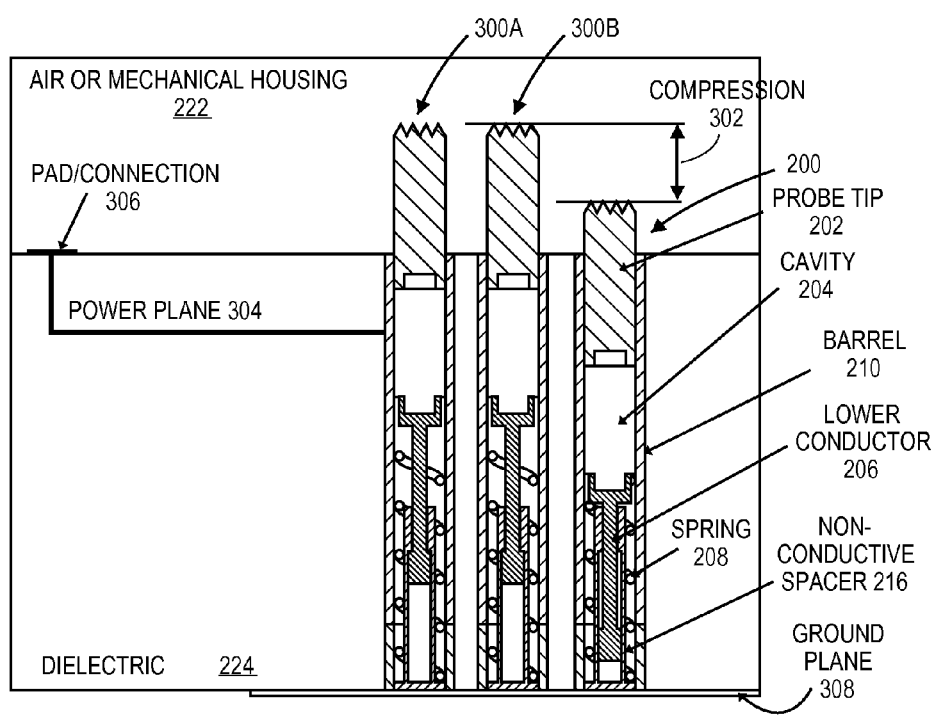
FIG. 3 illustrates a set of electro-mechanical interconnects according to one embodiment.

A resistor may be placed in cavity 204 when increased resistance is desired or necessitated, a capacitor may be placed in cavity 204 when increased capacitance is desired or necessitated, or the like, to obtain the best testing data for the DUT, etc. For example, a capacitor placed in cavity 204 may function or serve as a buffer between the two separate electrical paths A 212 and B 214 and the two isolated conductors, such as upper conductor 202 attached to DUT and its electrical path leading to housing/air 222 via a power plane and pad/connection as shown in FIG. 3, while lower conductor linking to ground. Using this novel technique, the capacitor in cavity 204 optimally conditions the power supply and usage by serving as a buffer. A component may be embedded and detained in cavity 204 using any number and type of existing holding techniques, such as via soldering, electrical connection, etc.

As will be further illustrated with reference to FIG. 3, in one embodiment, non-conductive spacer 216 is shown to separate barrel 210 (which is electrically connected to upper conductor 202) from the ground/reference plane at the bottom of interconnect 200. Additionally, it is to be noted that a physical contact between lower and upper conductors 206, 202 may be maintained by spring 208 and an electrical component or element residing within cavity 204 which may use materials like (but not limited to) solder, pastes, etc., to provide good electrical contact between the cavity element and upper and lower conductors 202, 206.

It is contemplated that dielectric 224 is not limited to being PCB and that it may include a PCB or any other component of a system platform, such as a socket or socket part of the pins. Stated differently, interconnect 200 is not limited to being used with a PCB and that it may be used in another capacity and with other components or assemblies, such as in a circuit board application or in a socket body, etc.

In one embodiment, PCB fabrication may be used to facilitate a separation of a layer to layer connection (such as power and ground connections within a single PCB via). This PCB fabrication along with having cavity 204 with an embedded electrical component may provide improved delivery performance by having ground decoupling the per pin power by way of a via construction, such as by using a controlled depth back-drilling PCB technology. For example, the plastic inside a single via to one or more specific layers may be removed by isolating the top part of the via from the lower part of the via, lower conductor 206 may be connected to a reference plane, such as dielectric 224. Once the reference plane has been electrically connected, the inserted capacitance or any other component in the cavity 204 may have the necessary and proper electrical connectivity to provide capacitor decoupling, signal conditioning, etc.

It is well-known that high-speed integrated circuits, such as processors and computer chipsets, exhibit improved performance when the power supplied to them is filtered with a capacitor placed physically close to a DUT, such as an IC. Such power decoupling capacitors may be used to smooth out voltage irregularities so that an ideal voltage supply may be provided to the testing DUT. Interconnect 200 having an embedded capacitor may help facilitate a proper proximity of the capacitance to the DUT. For example and in one embodiment, by enhancing capacitance through a capacitor embedded in cavity 204 directly in line with the electrical stimulus, the conventional horizontal electrical path to decoupling may be eliminated, while the vertical path may be minimized. This novel technique may limit the resistance and inductance path to conductive probe tip 202 and the ESR/ESL of interconnect 200 (serving as a decoupling capacitor).

Figure 2B:
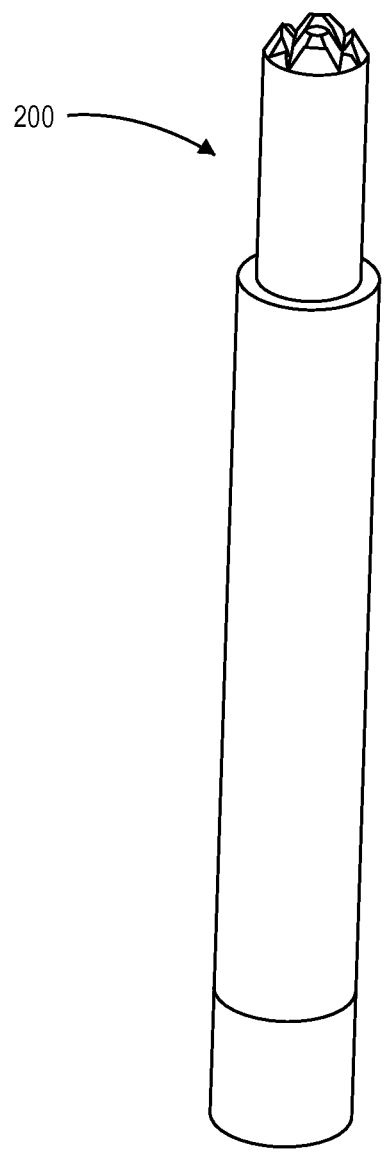

Now referring to FIG. 2B, it illustrates an outlook of electro-mechanical interconnect 200 as it may be viewed by a user.

It is contemplated that any number and type of components may be added to and/or removed from electro-mechanical interconnect 200 to facilitate various embodiments of the invention including adding, removing, and/or enhancing certain features. For brevity, clarity, and ease of understanding of electro-mechanical interconnect 200, many of the standard and/or known components, such as those of a computing device or a testing system or a DUT, are not shown or discussed here. It is contemplated that embodiments of the invention are not limited to any particular technology, topology, system, architecture, and/or standard and are dynamic enough to adopt and adapt to any future changes.

FIG. 3 illustrates a set of electro-mechanical interconnects 200, 300A, 300B according to one embodiment. Interconnects 300A and 300B are the same as interconnect 200 and thus, for brevity, various components of interconnect 200 previously discussed with reference to FIG. 2A are not discussed here. It is, however, to be noted that in the illustrated embodiment, interconnects 300A and 300B are shown in uncompressed or relaxed position, such as their conductive probe tips remain uncompressed. In contrast, interconnect 200 is shown in a compressed position, where probe tip 202 is compressed 302 relative to interconnects 300A, 300B. As illustrated, probe tip 202 is compressed 302 or moved down as it presses down on non-conductive spring 208 moving cavity 204 and lower conductor 206 down with it. It is to be noted that cavity 204 is not compressed; rather, it is simply moved down about the same amount as the amount of compression 302 of probe tip 202. It is to be further noted and as aforementioned with respect to FIG. 2A, in one embodiment, non-conductive spacer 216 is placed at the lower end of barrel 210 and is shown to separate barrel 210 (which is electrically connected to upper conductor 202) from ground/reference plane 308 at the bottom of interconnect 200.

In one embodiment, upper and lower conductors 202, 206 remain separate from each other in barrel 210 as the two electrical paths (of FIG. 2A) remain isolated from either other as facilitated by cavity 204 and its embedded component serving as a buffer and further facilitated by non-conductive spring 208. The first electrical path is provided through upper conductor 202 that is communication with pad/connection 306 through power plane 304, while the second electrical path is provided through lower conductor 206 that grounded through ground plane 308.

Figure 4:
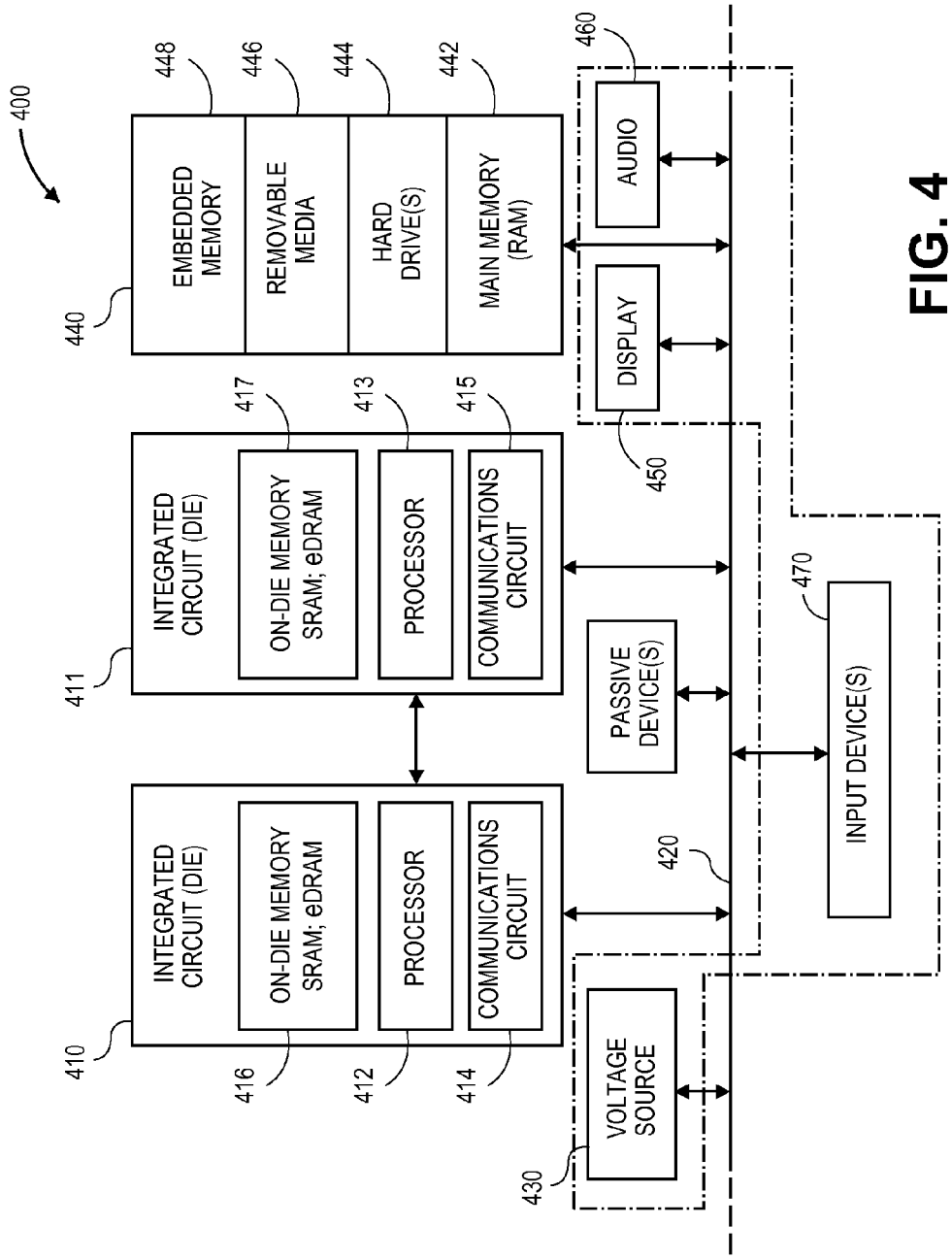
FIG. 4 illustrates one embodiment of a computer system.

FIG. 4 illustrates one embodiment of a computer system 400. The computer system 400 (also referred to as the electronic system 400) as depicted can embody a test system that includes an automated test equipment (ATE) system employing an electro-mechanical interconnect 200 of FIG. 2A. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be a server system. The computer system 400 may be a supercomputer or high-performance computing system.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically coupled to the system bus 420 and includes any circuit, or combination of circuits according to an embodiment. In an embodiment, the integrated circuit 410 includes a processor 412 that can be of any type. As used herein, the processor 412 may mean any type of circuit such as, but not limited to, a microprocessor, a microcontroller, a graphics processor, a digital signal processor, or another processor. In an embodiment, the processor 412 includes a thermal controller having a thermal control interface to receive test data from an automated test equipment (ATE) system and dynamically adjust a target setpoint temperature based on the data and a dynamic thermal controller to receive the target setpoint temperature from the thermal control interface and control a thermal actuator based on the target setpoint temperature as disclosed herein.

In an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. In an embodiment, the integrated circuit 410 includes on-die memory 416 such as static random-access memory (SRAM). In an embodiment, the integrated circuit 410 includes embedded on-die memory 416 such as embedded dynamic random-access memory (eDRAM).

In an embodiment, the integrated circuit 411 is complemented with a subsequent integrated circuit 411. Useful embodiments include a dual processor 413 and a dual communications circuit 415 and dual on-die memory 417 such as SRAM. In an embodiment, the dual integrated circuit 410 includes embedded on-die memory 417 such as eDRAM.

In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in an embedded TSV die stack, according to an embodiment.

In an embodiment, the electronic system 400 also includes a display device 450, an audio output 460. In an embodiment, the electronic system 400 includes an input device such as a controller 470 that may be a keyboard, mouse, trackball, game controller, microphone, voice-recognition device, or any other input device that inputs information into the electronic system 400. In an embodiment, an input device 470 is a camera. In an embodiment, an input device 470 is a digital sound recorder. In an embodiment, an input device 470 is a camera and a digital sound recorder.

As shown herein, the integrated circuit 410 can be implemented in a number of different embodiments, including a test system that includes a dynamic electro-mechanical interconnect having a cavity for separating, via the cavity, a first conductor of an interconnect from a second conductor of the interconnect, and isolating, via the cavity serving as a buffer, a first electrical path provided through the first conductor from a second electrical path provided through the second conductor. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents. A foundation substrate may be included, as represented by the dashed line of FIG. 4. Passive devices may also be included, as is also depicted in FIG. 4.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments or examples. Specifics in the examples may be used anywhere in one or more embodiments. The various features of the different embodiments or examples may be variously combined with some features included and others excluded to suit a variety of different applications. Some embodiments pertain to a method comprising: separating, via a cavity, a first conductor of an interconnect from a second conductor of the interconnect; and isolating, via the cavity serving as a buffer, a first electrical path provided through the first conductor from a second electrical path provided through the second conductor.

Embodiments or examples include any of the above methods wherein further comprising embedding an electrical component in the cavity, wherein the electrical component includes one or more of a capacitor, an inductor, a resistor, a dielectric filler material-based component, and a multi-terminal electronic component.

Embodiments or examples include any of the above methods further comprising a non-conductive spring proving mechanical support to the first and second conductors without having to provide an electrical connection to a voltage domain.

Embodiments or examples include any of the above methods wherein the first conductor comprises a probe head to couple the first conductor to a device under test (DUT) and further to a power plane.

Embodiments or examples include any of the above methods wherein the second conductor is coupled to a dielectic via a reference ground plane.

Embodiments or examples include any of the above methods wherein the DUT comprises one or more of a die on a wafer or a semiconductor package, wherein the semiconductor package includes a casing including one or more semiconductor electronic components.

In another embodiment or example, an apparatus comprises: an electro-mechanical assembly including: a first conductor providing a first electrical path; a second conductor providing a second electrical path; and a cavity between the first capacitor and the second capacitor, the cavity separating the first conductor from the second conductor.

Embodiments or examples include the apparatus above wherein the cavity embeds an electrical component including a capacitor, the electrical component isolating the first electrical path from the second electrical path.

Embodiments or examples include the apparatus above wherein the electrical component further comprises one or more of an inductor, a resistor, a dielectric filler material-based component, and a multi-terminal electronic component.

Embodiments or examples include the apparatus above further comprising a non-conductive spring proving mechanical support to the first and second conductors without having to provide an electrical connection to a voltage domain.

Embodiments or examples include the apparatus above wherein the first conductor comprises a probe head to couple the first conductor to a device under test (DUT) and further to a power plane.

Embodiments or examples include the apparatus above wherein the second conductor is coupled to a dielectic via a reference ground plane.

Embodiments or examples include the apparatus above wherein the DUT comprises one or more of a die on a wafer or a semiconductor package, wherein the semiconductor package includes a casing including one or more semiconductor electronic components.

In another embodiment or example, a system comprises: an automated test equipment (ATE) system including an electro-mechanical interconnect to couple a device under test (DUT) and a dielectric, wherein the electro-mechanical interconnect includes: a first conductor providing a first electrical path; a second conductor providing a second electrical path; and a cavity between the first capacitor and the second capacitor, the cavity separating the first conductor from the second conductor.

Embodiments or examples include the system above wherein the cavity embeds an electrical component including a capacitor, the electrical component isolating the first electrical path from the second electrical path.

Embodiments or examples include the system above wherein the electrical component further comprises one or more of an inductor, a resistor, a dielectric filler material-based component, and a multi-terminal electronic component.

Embodiments or examples include the system above further comprising a non-conductive spring proving mechanical support to the first and second conductors without having to provide an electrical connection to a voltage domain.

Embodiments or examples include the system above wherein the first conductor comprises a probe head to couple the first conductor to a device under test (DUT) and further to a power plane.

Embodiments or examples include the system above wherein the second conductor is coupled to a dielectic via a reference ground plane.

Embodiments or examples include the system above wherein the DUT comprises one or more of a die on a wafer or a semiconductor package, wherein the semiconductor package includes a casing including one or more semiconductor electronic components.

In another embodiment or example, an apparatus comprises means for performing any one or more of the operations mentioned above.

In yet another embodiment or example, at least one machine-readable medium comprising a plurality of instructions that in response to being executed on a computing device, causes the computing device to carry out a method according to any one or more of the operations mentioned above.

In yet another embodiment or example, at least one non-transitory or tangible machine-readable comprising a plurality of instructions that in response to being executed on a computing device, causes the computing device to carry out a method according to any one or more of the operations mentioned above.

In yet another embodiment or example, a computing device arranged to perform a method according to any one or more of the operations mentioned above.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. An apparatus comprising:
an electro-mechanical assembly including:
a first conductor providing a first electrical path;
a second conductor providing a second electrical path; and
one or more electrical components embedded within a cavity between the first conductor and the second conductor such that the first conductor is kept isolated from the second conductor, wherein the cavity represents an empty space occupying a portion of a conductive barrel of variable length and size capable of embedding and accepting the one or more electrical components, wherein the one or more electrical components to serve as a buffer keeping the first electric path associated with the first conductor isolated from the second electric path associated with the second conductor, wherein the one or more electrical components include a capacitor or a resistor, wherein the capacitor is placed in the cavity to serve as a buffer between at least one of the first and second electric paths and the first and second conductors, wherein the capacitor is further to condition a power supply and usage within the apparatus by serving as the buffer, wherein the resistor is placed in the cavity when increased resistance is desired or necessitated at the apparatus, or to assist with obtaining resulting testing data.

2. The apparatus of claim 1, wherein the one or more electrical components further comprise one or more of an inductor, a dielectric filler material-based component, and a multi-terminal electronic component.

3. The apparatus of claim 1, further comprising a spring including a non-conductive spring providing mechanical support to the first and second conductors without having to provide an electrical connection to a voltage domain, wherein the spring to provide necessary mechanical compliance for compression and decompression purposes.

4. The apparatus of claim 1, wherein the first conductor comprises an upper conductor including a probe head to couple the first conductor to a device under test (DUT) and further to a power plane, wherein the first conductor is placed in an electrical contact with the second conductor via the cavity using one or more of the spring, the one or more electrical components, and one or more bonding materials including a soldering paste.

5. The apparatus of claim 1, wherein the second conductor comprises a lower conductor coupled to a dielectic via a reference ground plane.

6. The apparatus of claim 4, wherein the DUT comprises one or more of a die on a wafer or a semiconductor package, wherein the semiconductor package includes a casing including one or more semiconductor electronic components.

7. A system comprising:
an automated test equipment (ATE) system, wherein the ATE system comprises an electro-mechanical interconnect to couple a device under test (DUT) and a dielectric, wherein the electro-mechanical interconnect includes:
a first conductor providing a first electrical path;
a second conductor providing a second electrical path; and
one or more electrical components embedded within a cavity between the first conductor and the second conductor such that the first conductor is kept isolated from the second conductor, wherein the cavity represents an empty space occupying a portion of a conductive barrel of variable length and size capable of embedding and accepting the one or more electrical components, wherein the one or more electrical components to serve as a buffer keeping the first electric path associated with the first conductor isolated from the second electric path associated with the second conductor, wherein the one or more electrical components include a capacitor or a resistor, wherein the capacitor is placed in the cavity to serve as a buffer between at least one of the first and second electric paths and the first and second conductors, wherein the capacitor is further to condition a power supply and usage within the system by serving as the buffer, wherein the resistor is placed in the cavity when increased resistance is desired or necessitated at the system, or to assist with obtaining resulting testing data.

8. The system of claim 7, wherein the one or more electrical components further comprise one or more of an inductor, a dielectric filler material-based component, and a multi-terminal electronic component.

9. The system of claim 7, further comprising a spring including a non-conductive spring providing mechanical support to the first and second conductors without having to provide an electrical connection to a voltage domain, wherein the spring to provide necessary mechanical compliance for compression and decompression purposes.

10. The system of claim 7, wherein the first conductor comprises an upper conductor including a probe head to couple the first conductor to a device under test (DUT) and further to a power plane, wherein the first conductor is placed in an electrical contact with the second conductor via the cavity using one or more of the spring, the one or more electrical components, and one or more bonding materials including a soldering paste.

11. The system of claim 7, wherein the second conductor comprises a lower conductor coupled to a dielectic via a reference ground plane.

12. The system of claim 7, wherein the DUT comprises one or more of a die on a wafer or a semiconductor package, wherein the semiconductor package includes a casing including one or more semiconductor electronic components.

13. A method comprising:
providing a first electric path via a first conductor;
providing a second electric path via a second conductor; and
isolating, via the cavity, the first conductor from the second conductor, wherein the cavity embeds one or more electrical components serving as a buffer keeping the first electrical path associated with the first conductor isolated from the second electrical path associated with the second conductor, wherein the cavity represents an empty space occupying a portion of a conductive barrel of variable length and size capable of embedding and accepting the one or more electrical components, wherein the one or more electrical components include a capacitor or a resistor, wherein the capacitor is placed in the cavity to serve as a buffer between at least one of the first and second electric paths and the first and second conductors, wherein the capacitor is further to condition a power supply and usage within an apparatus by serving as the buffer, wherein the resistor is placed in the cavity when increased resistance is desired or necessitated at the apparatus, or to assist with obtaining resulting testing data.

14. The method of claim 13, wherein the one or more electrical components further comprise one or more of a capacitor, an inductor, a resistor, a dielectric filler material-based component, and a multi-terminal electronic component, wherein the spring to provide necessary mechanical compliance for of compression and decompression purposes.

15. The method of claim 13, further comprising a spring including a non-conductive spring providing mechanical support to the first and second conductors without having to provide an electrical connection to a voltage domain.

16. The method of claim 13, wherein the first conductor comprises an upper conductor including a probe head to couple the first conductor to a device under test (DUT) and further to a power plane, wherein the first conductor is placed in an electrical contact with the second conductor via the cavity using one or more of the spring, the one or more electrical components, and one or more bonding materials including a soldering paste.

17. The method of claim 13, wherein the second conductor comprises a lower conductor coupled to a dielectic via a reference ground plane.

18. The method of claim 16, wherein the DUT comprises one or more of a die on a wafer or a semiconductor package, wherein the semiconductor package includes a casing including one or more semiconductor electronic components.

* * * * *